United States Patent [19]

Weinert et al.

[11] 3,956,718

[45] May 11, 1976

[54] CRYSTALS HAVING ZERO TEMPERATURE COEFFICIENTS OF DELAY

[75] Inventors: Robert W. Weinert, Monroeville; Thelma J. Isaacs, Murrysville, both of Pa.

[73] Assignee: Westinghouse Electric Corporation, Pittsburgh, Pa.

[22] Filed: Jan. 10, 1975

[21] Appl. No.: 540,194

[52] U.S. Cl.............................. 333/30 R; 252/62.9; 310/9.5
[51] Int. Cl.² .................. H03H 9/30; H01L 41/18; B01J 17/06
[58] Field of Search ................. 310/8, 8.1, 8.2, 9.5; 333/30 R, 72; 252/62.9 R

[56] References Cited
UNITED STATES PATENTS 3,746,866  7/1973  Feichtner et al................ 350/161 X
3,818,382  6/1974  Holland et al. ............... 333/30 R X

OTHER PUBLICATIONS

Cermak, "Width of the Energy Gap of Some Ternary Chalcogenides" in Collection Czechoslov Commun, Vol. 34, 1969, pp. 3605–3609.

Primary Examiner—Alfred E. Smith
Assistant Examiner—Marvin Nussbaum
Attorney, Agent, or Firm—R. D. Fuerle

[57] ABSTRACT

Crystals or $Tl_3VS_4$, $Tl_3VSe_4$, $Tl_3NbS_4$, $Tl_3NbSe_4$, $Tl_3TaS_4$, and $Tl_3TaSe_4$ are disclosed which have a surface containing of normal to a zero temperature coefficient of delay direction. The crystals are used to transmit acoustic waves in surface and bulk wave devices.

23 Claims, No Drawings

CRYSTALS HAVING ZERO TEMPERATURE COEFFICIENTS OF DELAY

CROSS REFERENCE TO RELATED APPLICATIONS

This application is related to application Ser. No. 392,695 filed Aug. 29, 1973, now abandoned, by Thelma J. Isaacs, Milton Gottlieb, John D. Feichtner, and Andrea A. Price, titled "$Tl_3VS_4$ and $Tl_3NbS_4$ Crystals and Acousto-Optical Devices." That application claims single crystals of $Tl_3VS_4$, $Tl_3NbS_4$, and non-conducting mixtures thereof, and acousto-optical systems and an acoustic delay line using the single crystals.

This application is related to application Ser. No. 540,192, filed of even date by Thelma J. Isaacs and Milton Gottlieb titled "$Tl_3TaS_4$ and $Tl_3TaSe_4$ Crystals and Acousto-Optical Devices."

This application is also related to application Ser. No. 540,193, filed of even date by T. J. Isaacs and R. W. Weinert titled "Acoustic Surface Wave Devices Using $Tl_3TaS_4$ and $Tl_3TaSe_4$ Crystals."

This application is also related to application Ser. No. 463,337, filed Apr. 23, 1974 by T. J. Isaacs and M. R. Daniel titled "Acoustic Surface Wave Device." That application describes surface wave devices which use crystals of $Tl_3VS_4$, $Tl_3NbS_4$, or mixtures thereof.

BACKGROUND OF THE INVENTION

Field of the Invention

There are many types of devices which require the transmission of an acoustic wave through a material such as bulk and surface wave resonators, delay lines, filters, and pulse compressors. In most such devices it is important that the time of travel, the frequency response of the transducer, and the phase of the acoustic wave remain constant despite variations in the temperature of the material used. Since the time of travel, frequency response, and phase vary with temperature in almost all materials, it is often necessary to place the material in a temperature-controlled environment, which is bulky, expensive, and unsuitable for applications where weight, space, or energy requirements are important, such as a ship, plane, or spacecraft.

Another approach to the problem is to use a material which has a zero temperature coefficient of delay (ZTCD) over the temperature range of interest. A ZTCD material is a material over which or through which an acoustic wave will travel in a constant period of time over a limited temperature range. If the material has a ZTCD, the frequency response of the transducer and phase of the acoustic wave will also be constant over the temperature range because the three properties are equivalent. Even if the temperature range is narrow, it is easier to keep a material within a range than to keep it at a single constant temperature.

Until now the only known material having a ZTCD over a useful temperature range was quartz. There are certain directions, and only certain directions through a quartz crystal which display the property of ZTCD (e.g., the ST cut which is a + 42¾° rotated Y cut and propagation along the X axis is a ZTCD direction at 20°C ±20°C with a variance of about 10ppm at the ends of the range.) Out of all the piezoelectric materials in existence only quartz was known to have this unique, in fact, until now sui generis, property. It is not difficult to understand why the property is so unique, for as the temperature of material changes it undergoes thermal expansion or contraction and the velocity of an acoustic wave passing through it alters. One or both of these changes may be non-linear, and the changes may not necessarily be in the same direction or the same magnitude. In order for the time of travel to remain constant, changes in the volume of the material and the wave velocity must exactly cancel each other as the temperature varies, which is a highly improbable coincidence.

Although until now unique, quartz nevertheless has a number of other properties which could be improved upon. Supplies of good natural quartz crystals are being depleted and synthetic quartz crystals can only be made by a very expensive and time-consuming process. A lower acoustic velocity than that of quartz (3.16 × $10^5$ cm/sec for surface waves in the ST direction) is desirable as that would enable the devices to be made smaller. Finally, the coupling coefficient $K^2$ of quartz is low (0.17 for ST cut) which means that quartz devices cannot efficiently transmit wide band acoustic waves. (The coupling coefficient is a measure of the efficiency with which electrical energy can be converted to acoustic energy in the crystal).

In order to find other materials possessing a ZTCD direction which may have more desirable properties than quartz, a great deal of money and scientific effort has been expended, so far, completely unsuccessfully.

PRIOR ART

An article entitled "Magnetic Ausceptibility of Ternary Compounds $Tl_3VS_4$ and $Tl_3TaS_4$" by M. Matzas and K. Cermak appears on pages 1305 and 1306 of the Czechoslovakian Journal of Physics (1969).

An article entitled "Luminescence Spectra of Ternary Compounds of $Tl_3BX_4$ Type" by M. A. Goryanora, V. M. Orlov, W. L. Sokolova, E. V. Tsvetkova, and Yu. G. Shreter appears on pages K127 and K128 of Physics Status Solidi (1972).

An article entitled "Some Ternary Thallium Chalcogenides" by C. Crevecoeur appears in the January-June 1964 volume (Volume No. 17) of Acta Crystallographica on page 757. That article describes the preparation and characteristics of the isomorphous compounds $Tl_3VS_4$, $Tl_3NbS_4$, $Tl_3TaS_4$, $Tl_3VSe_4$, $Tl_3NbSe_4$, and $Tl_3TaSe_4$. Large, single crystals were not prepared and non-linear and acousto-optical properties are not mentioned.

SUMMARY OF THE INVENTION

We have discovered that crystals of $Tl_3VS_4$, $Tl_3VSe_4$, $Tl_3NbS_4$, $Tl_3NbSe_4$, $Tl_3TaS_4$, and $Tl_3TaSe_4$ possess ZTCD directions.

In addition, these crystals are superior to quartz in a number of ways. They can be grown in a few days in relatively inexpensive equipment. Their acoustic velocity is less than that of quartz, which means that devices using them can be smaller. Finally, the coupling coefficient, $K^2$, of the crystals is much higher than that of quartz.

DESCRIPTION OF THE INVENTION

The crystals of this invention have the approximate composition $Tl_3BX_4$ where B is vanadium, niobium, or tantalum, and X is sulfur or selenium. Mixtures of the crystals (e.g., $Tl_3VS_2Se_2$) are also contemplated, although they may not be as easily grown as unmixed crystals. The preferred crystals are $TlVS_4$ and $TlTaS_4$, especially the latter, due to their high coupling coefficients. The ideal crystal compositions (i.e., the compositions of maximum stability and properties) are not known, but may be nonstoichiometric. Therefore, crystals within about 5% of stoichiometric are contemplated within the scope of this invention.

The compounds used to prepare the crystals of this invention may be prepared from very pure quantities of the elements involved. First, the thallium is washed in distilled water and the tantalum, vanadium, and niobium in dilute mineral acid to remove oxides which may interfere with crystal growth. Then the elements are mixed and melted together in evacuated containers until they react to form the compound. Several days of heating the melt may be required. The temperature of the melt must be maintained considerably above the melting point (e.g., at 800 to 1000°C) in order for a complete reaction to occur within a reasonable period of time (e.g., a few days).

A crystal may be prepared by the Stockbarger technique by sealing the compound in a silica glass tube under argon, melting it, and lowering it very slowly (10 to 15 mm/day) through a two-zone furnace having a steep temperature gradient (8 to 14°C/mm) at its melting point. The crystals are then oriented, cut, and ground.

The crystals of this invention are piezoelectric and cubic. They have the CsCl structure, $I\bar{4}3m$, with two formula units per unit cell, and their diffraction aspect derived from X-ray data is I***.

In order for a crystal to have utility in an application using its ZTCD property with present technology it should be at least about 1 mm long, at least about 1 mm wide, and at least about 1 mm thick. For most ZTCD surface wave applications a crystal should have a surface at least about 1 mm long, and at least about 1 mm wide. The crystal must have at least one surface which is parallel to a ZTCD direction (for surface wave applications) or normal to a ZTCD direction (for bulk wave applications). Most crystals will be rectangular and therefore will have surfaces parallel and normal to a ZTCD direction.

Due to the symmetry of the crystals, for each ZTCD direction there are other equivalent ZTCD directions. For example, if a crystal has a $1\bar{1}0$ ZTCD direction it will have ZTCD directions in any of its dodecahedral directions, if it has a 100 ZTCD direction it will have ZTCD directions in any of its cubic directions, and if it has a $1\bar{1}1$ ZTCD direction it will have ZTCD directions in any of its octahedral directions. So far, two independent ZTCD directions have been found for the $Tl_3VS_4$ crystal, and it is probable that all of the crystals have more than one independent ZTCD direction. These additional independent ZTCD directions, if they exist, can be found by routine experiment with or without the aid of a computer. The ZTCD directions found so far are for surface waves. Because ZTCD directions exist in these crystals for surface waves it is likely that ZTCD directions will also exist in the crystals for bulk waves, although the directions may be different. It is expected that there would be more bulk wave independent ZTCD directions in the crystals than surface wave ZTCD directions.

EXAMPLE I

The following compositions were prepared by washing a quantity of thallium in distilled water and tantalum, vanadium, and niobium dilute mineral acid, then weighing out very precise amounts of the required elements:

| Composition | Element (grams) | | | | | Crystal Growth Rate (mm/day) |
| --- | --- | --- | --- | --- | --- | --- |
| | Tl | V | Ta | S | Se | |
| $Tl_3VS_{4.02}$ | 12.2622 | 1.0188 | | 2.5778 | | 17 |
| $Tl_3VS_{4.01}$ | 12.2622 | 1.0188 | | 2.5715 | | 18 |
| $Tl_3TaS_{4.02}$ | 10.3921 | | 3.0571 | 2.1848 | | 11.9 |
| $Tl_3TaSe_{4.02}$ | 6.1311 | | 1.8095 | | 3.1742 | 16.7 |

The elements for each of the compositions were placed in silica-glass ampoules which were sealed under vacuum. The ampoules were heated to between 950° and 1000°C and held at that temperature for several days, with intermittent shaking throughout the period. After cooling, the compounds were placed in crystal-growing tubes and sealed under 0.8 atmospheres of pure, dry argon gas. The tubes were heated above the melting points of the compounds and lowered through a temperature gradient of 8° to 14°C/mm at the melting point at the rate given in the above table. The crystals were about 0.8 cm by 0.8 cm by 2.5 cm. They were oriented, cut, and polished.

The ZTCD directions of two of the crystals were then determined experimentally for surface waves by applying interdigitated gold sender and receiver grids to a surface of the crystal at various angles and measuring phase changes at different temperatures. The power flow angle and the velocity were calculated. The following table gives the results:

| Crystal | Cut | Propagation Direction | Power Flow Angle | Velocity in Propagation Direction ($\times 10^5$ cm/sec) |
| --- | --- | --- | --- | --- |
| $Tl_3VS_{4.01}$ | $1\bar{1}0\pm1°$ | 12°±1° from 100 | −6° | 0.87 |
| $Tl_3TaSe_{4.005}$ | 001±1° | 0°±1° from 110 | 0° | 0.75 |

The range for the above ZTCD directions is from −10° to +30°C with less than 10ppm variance within the range.

The cut is the surface of the crystal in which the ZTCD direction lies. The propagation direction is measured from a line normal to the wave fronts. The power flow angle is the direction that the surface wave is moving and is measured from a line normal to the wave fronts. Because of their similarity to the $Tl_3VS_4$ and $Tl_3TaSe_4$ crystals, the other crystals of this invention are also expected to have ZTCD directions.

In addition to the above-described crystals, large (i.e., > 0.5 × 0.5 × 1 cm) single crystals of the following compositions were also grown: $Tl_3VS_4$, $Tl_3VS_{4.02}$, $Tl_3V_{0.95}S_4$, $Tl_3NbS_{4.02}$, $Tl_3Nb_{0.99}S_4$, $Tl_3TaS_{4.005}$, and $Tl_3TaS_2Se_2$. It should be noted that while the compositions given for the crystals are the compositions that the proportions of starting materials are expected to produce rather than the composition of the crystals as analyzed, the actual crystal compositions are believed to be within about 1% of the compositions given.

EXAMPLE II

In addition to the above experimental results, the ZTCD directions of several of the crystals have been estimated using a computer program prepared by William R. Jones, James J. Campbell, and Sinja L. Veilleux described in Government Report number AFCRL 70020.

The program uses as inputs the elastic constant, the piezoelectric constant, the dielectric constant, density variations in some or all of these constants with temperature, and the crystal structure. The computer then plots the surface wave acoustic velocities at different directions in a given crystal cut. The plots are repeated at different temperatures. From this information, the temperature coefficients of delay are easily calculated and plotted to determine where they are zero. The following table gives the results:

| Crystal | Cut | Propagation Direction | Power Flow Angle | Velocity ($\times 10^5$cm/sec) |
|---|---|---|---|---|
| $Tl_3VS_{4.01}$ | $1\bar{1}0$ | 33° from 100 | −13° | 0.93 |
| $Tl_3TaSe_{4.02}$ | $1\bar{1}0$ | 35° from 100 | −13° | 0.81 |
| $Tl_3TaS_{4.02}$ | $1\bar{1}0$ | 2° from 100 | −1° | 0.69 |
| $Tl_3VS_{4.02}$ | $1\bar{1}1$ | 29.8° from 110 | −7° | 0.99 |

The calculated range for the above calculated ZTCD directions is from 15° to 35°C.

Although the propagation angles do not coincide with the experimental angles (12° for $Tl_3VS_{4.01}$ experimentally versus 33° for $Tl_3VS_{4.02}$ by computer), this may be due to the slight difference in the composition of the crystals and to possible error in the input members used in the computer calculation. Results to date suggest, however, that if the computer program indicates that there is a ZTCD direction in a certain cut, one will be found in that cut.

EXAMPLE III

Using crystals prepared as in Example I, various properties of three of the crystals were experimentally determined:

| | $Tl_3VS_4$ | $Tl_3TaS_4$ | $Tl_3TaSe_4$ |
|---|---|---|---|
| 1. length of axes (A) | 7.497±.004 A | — | — |
| 2. transparency region ($\mu$m) | 0.78 to 10 | 0.6 to 12.5 | 0.7* to 15.2* |
| 3. melting point (°C) | 505±5°C | 545±5°C | 600±5°C |
| 4. refractive index at | | | |
| 0.6328 $\mu$m | — | 2.4* | 2.58* |
| 0.825 $\mu$m | 3.08 | | |
| 1.06 $\mu$m | 2.95 | — | — |
| 1.15 $\mu$m | 2.93 | — | — |
| 5. acoustic velocity (cm/sec) | | | |
| Longitudinal waves | | | |
| along c-axis | $2.81 \times 10^5$ | $2.69 \times 10^5$ | $2.4 \times 10^5$ |
| in 110 direction | $2.46 \times 10^5$ | $2.22 \times 10^5$ | $2.1 \times 10^5$ |
| Slow shear waves | | | |
| along c-axis | $8.73 \times 10^4$ | $6.89 \times 10^4$ | $7.55 \times 10^4$ |
| in 110 direction | $9.58 \times 10^4$ | $7.87 \times 10^4$ | $8.53 \times 10^4$ |
| Surface waves | $8.7 \times 10^4$ | $8.7 \times 10^4$ | $8.7 \times 10^4$ |
| 6. ultrasonic attenuation (dB/$\mu$sec at 30MHZ for longitudinal waves in 110 direction | | 0.14 | |
| 7. effective coupling coefficient for surface waves (%) | 1.39 (100),(110) | 3.46 (110),(110) | 0.48 (100),(110) |
| 8. acousto-optical figure of merit longitudinal waves in 110 direction | 150 (1) | 207 (2) | 325 (1) |
| shear waves along the c-axis | 500 (2) | — | — |

*estimated
(1) at 0.6328$\mu$m
(2) at 1.15$\mu$m

Some of the above figures should be considered to be approximate and may be refined by further experimentation.

The bulk acoustic properties in the above table were determined by the conventional pulse-echo technique in which a pair of crystal quartz transducers are cemented onto opposing, flat, parallel faces of the crystal samples.

The acousto-optical figure of merit was measured by acoustically bonding the crystals onto a fused quartz buffer rod, so that an acoustic pulse could be transmitted from the quartz to the crystal. By measuring the light diffracted by the crystals, the figure of merit of the crystal relative to that of quartz was determined.

The other crystals of this invention are expected to have properties of about the same order as the properties given for the $Tl_3VS_4$, $Tl_3TaS_4$, and $Tl_3TaSe_4$ crystals.

Because the crystals of this invention have high acousto-optical figures of merit they are expected to be useful in various acousto-optical devices including display devices, laser modulators, and non-collinear tunable filters.

The crystals of this invention also display non-linear properties which may be of use in certain devices not requiring phase-matching such as acousto-optical delay lines.

In addition, due to their ZTCD property, they are useful in many other applications such as surface wave modulators and pulse compressors.

EXAMPLE IV

A crystal rod 1 cm long and about 0.6 cm square of $Tl_3VS_{4.02}$ was prepared as in Example I. Quartz transducers were glued to each flat, parallel end of the rod so that waves could be generated normal to the Z axis (i.e., in the 0.001 direction). The rod was placed in an oven and standing shearmode bulk waves were generated in the crystal. The temperature of the crystal was raised and the frequency of the wave was changed so that acoustic resonance was maintained over the temperature range. From this data the temperature coefficient of delay was calculated and was found to be −62 ppm (i.e., for each °C change in temperature the delay or frequency changes by −62 ppm).

The experiment was repeated after gluing the quartz transducers to the flat, parallel sides of the crystal so that the wave was propagated along a 110 direction with the shear wave polarized along a second 110 direction. This time the temperature coefficient of delay was +380 ppm.

Thus, a zero temperature coefficient of delay direction had to lie in between these two directions. A linear approximation of the zero direction was made and it was found to be about 13° from a 001 direction going towards a 110 direction, with the 13° rotation occurring in a plane perpendicular to a 110 direction. The temperature range over which the bulk zero temperature coefficient of the delay is expected to be displayed is about 0° to about 30°C.

What is claimed is:

1. A single crystal having the approximate composition $Tl_3BX_4$ and having a surface selected from the group consisting of surfaces containing a zero temperature coefficient of acoustic delay direction, surfaces normal to a zero temperature coefficient of acoustic delay direction, and both types of surfaces, where B is selected from the group consisting of vanadium, niobium, tantalum, and mixtures thereof, and X is selected from the group consisting of sulfur, selenium, and mixtures thereof.

2. A crystal according to claim 1 which has at least one surface containing a zero temperature coefficient of acoustic delay direction and at least one surface which is normal to a zero temperature coefficient of acoustic delay direction.

3. A crystal according to claim 1 wherein said surface contains a zero temperature coefficient of acoustic delay direction.

4. A crystal according to claim 1 wherein said surface is normal to a zero temperature coefficient of acoustic delay direction.

5. A crystal according to claim 1 wherein said surface is at least about one mm wide and at least about one mm long.

6. A crystal according to claim 1 which has the composition $Tl_3VS_4$ within ± 5% of stoichiometric.

7. A crystal according to claim 6 wherein said surface is one of the dodecahedral directions.

8. A crystal according to claim 6 wherein said surface is one of the octahedral directions.

9. A crystal according to claim 1 which has the composition $Tl_3NbS_4$ within ±5% of stoichiometric.

10. A crystal according to claim 1 which has the composition $Tl_3TaS_4$ within ±5% of stoichiometric.

11. A crystal according to claim 10 wherein said surface is one of the dodecahedral directions.

12. A crystal according to claim 1 which has the composition $Tl_3TaSe_4$ within ±5% of stoichiometric.

13. A crystal according to claim 12 wherein said surface is one of the cubic directions.

14. A crystal according to claim 13 which has at least two parallel surfaces normal to the 110 direction and normal to said surface which is one of the cubic directions.

15. A crystal according to claim 12 wherein said surface is one of the dodecahedral directions.

16. A crystal according to claim 1 which has the composition $Tl_3VSe_4$ within about ±5% of stoichiometric.

17. A crystal according to claim 1 which is at least one millimeter long, at least one millimeter wide, and at least one millimeter thick.

18. A crystal according to claim 17 which is larger than 0.5 × 0.5 × 1cm.

19. A crystal according to claim 1 wherein said crystal composition is within about 5% of stoichiometric.

20. A method of propagating an acoustic surface wave in a crystal having the approximate composition $Tl_3BX_4$ where B is selected from the group consisting of vanadium, niobium, tantalum, and mixtures thereof, and X is selected from the group consisting of sulfur, selenium, and mixtures thereof comprising forming a surface on said crystal which contains a zero temperature coefficient of acoustic delay direction, and generating an acoustic wave in said surface in said zero temperature coefficient of acoustic delay direction.

21. A method according to claim 20 including the additional step of detecting said acoustic wave after it has traversed at least a portion of said surface.

22. A method of propagating a bulk acoustic wave in a crystal having the approximate composition $Tl_3BX_4$ where B is selected from the group consisting of vanadium, niobium, tantalum, and mixtures thereof, and X is selected from the group consisting of sulfur, selenium, and mixtures thereof, comprising forming a surface on said crystal which is normal to a zero temperature coefficient of acoustic delay direction and generating a bulk acoustic wave in said crystal in said zero temperature coefficient of acoustic delay direction.

23. A method according to claim 22 including the additional step of detecting said acoustic wave after it has passed through said crystal.

* * * * *